United States Patent
O'Donnell

(10) Patent No.: US 8,935,990 B2
(45) Date of Patent: Jan. 20, 2015

(54) LOW CONTAMINATION COMPONENTS FOR SEMICONDUCTOR PROCESSING APPARATUS AND METHODS FOR MAKING COMPONENTS

(75) Inventor: Robert J. O'Donnell, Alameda, CA (US)

(73) Assignee: Lam Research Corporation, Fremont, CA (US)

( * ) Notice: Subject to any disclaimer, the term of this patent is extended or adjusted under 35 U.S.C. 154(b) by 40 days.

(21) Appl. No.: 12/349,949

(22) Filed: Jan. 7, 2009

(65) Prior Publication Data

US 2009/0120790 A1    May 14, 2009

Related U.S. Application Data

(60) Division of application No. 12/230,413, filed on Aug. 28, 2008, which is a continuation of application No. 10/837,575, filed on May 4, 2004, now abandoned, which is a division of application No. 10/101,701, filed on Mar. 21, 2002, now Pat. No. 6,780,787.

(51) Int. Cl.
C23C 16/00 (2006.01)
H01L 21/306 (2006.01)
(Continued)

(52) U.S. Cl.
CPC ............. *H01J 37/32495* (2013.01); *C23C 4/02* (2013.01); *C23C 4/10* (2013.01); *C23C 14/564* (2013.01); *C23C 16/4404* (2013.01); *C23C 28/00* (2013.01); *C23C 28/34* (2013.01); *C23C 30/00* (2013.01); *C23C 28/042* (2013.01); *C23C 28/044* (2013.01); *C23C 28/322* (2013.01); *C23C 28/341* (2013.01);
(Continued)

(58) Field of Classification Search
USPC ........................... 118/715, 723 R; 156/345.1
See application file for complete search history.

(56) References Cited

U.S. PATENT DOCUMENTS

3,630,770 A    12/1971  Favreau
4,340,462 A     7/1982  Koch
(Continued)

FOREIGN PATENT DOCUMENTS

EP    63206397         8/1988
EP    0555546 A1       8/1993
(Continued)

OTHER PUBLICATIONS

English Machine Translation of JP 10-004083, retrieved from the JPO website Jul. 28, 2010.*
(Continued)

*Primary Examiner* — Maureen Gramaglia
(74) *Attorney, Agent, or Firm* — Buchanan Ingersoll & Rooney PC

(57) ABSTRACT

Components of semiconductor processing apparatus axe formed at least partially of erosion, corrosion and/or corrosion-erosion resistant ceramic materials. Exemplary ceramic materials can include at least one oxide, nitride, boride, carbide and/or fluoride of hafnium, strontium, lanthanum oxide and/or dysprosium. The ceramic materials can be applied as coatings over substrates to form composite components, or formed into monolithic bodies. The coatings can protect substrates from physical and/or chemical attack. The ceramic materials can be used to form plasma exposed components of semiconductor processing apparatus to provide extended service lives.

15 Claims, 4 Drawing Sheets

(51) Int. Cl.
| | |
|---|---|
| *H01J 37/32* | (2006.01) |
| *C23C 4/02* | (2006.01) |
| *C23C 4/10* | (2006.01) |
| *C23C 14/56* | (2006.01) |
| *C23C 16/44* | (2006.01) |
| *C23C 28/00* | (2006.01) |
| *C23C 30/00* | (2006.01) |
| *C23C 28/04* | (2006.01) |

(52) U.S. Cl.
CPC .......... *C23C 28/345* (2013.01); *C23C 28/3455* (2013.01); *C23C 28/347* (2013.01)
USPC .................................. 118/723 R; 156/345.1

(56) References Cited

U.S. PATENT DOCUMENTS

| | | | |
|---|---|---|---|
| 4,948,458 | A | 8/1990 | Ogle |
| 5,089,746 | A | 2/1992 | Rosenblum et al. |
| 5,200,232 | A | 4/1993 | Tappan et al. |
| 5,262,029 | A | 11/1993 | Erskine et al. |
| 5,443,686 | A | 8/1995 | Jones et al. |
| 5,810,936 | A | 9/1998 | Leung et al. |
| 5,820,723 | A | 10/1998 | Benjamin et al. |
| 5,824,605 | A | 10/1998 | Chen et al. |
| 5,837,057 | A | 11/1998 | Koyama et al. |
| 5,838,529 | A | 11/1998 | Shufflebotham et al. |
| 5,863,376 | A | 1/1999 | Wicker et al. |
| 5,934,900 | A | 8/1999 | Billings |
| 5,964,947 | A | 10/1999 | Zhao et al. |
| 6,033,741 | A | 3/2000 | Haruta et al. |
| 6,048,798 | A | 4/2000 | Gadgil et al. |
| 6,071,627 | A * | 6/2000 | Yasuda et al. .................. 428/610 |
| 6,123,791 | A | 9/2000 | Han et al. |
| 6,129,808 | A | 10/2000 | Wicker et al. |
| 6,352,611 | B1 | 3/2002 | Han et al. |
| 6,444,304 | B1 | 9/2002 | Hisamoto et al. |
| 6,479,108 | B2 | 11/2002 | Hariharan et al. |
| 6,777,045 | B2 | 8/2004 | Lin et al. |
| 6,780,787 | B2 | 8/2004 | O'Donnell |
| 6,783,863 | B2 | 8/2004 | Harada et al. |
| 6,916,559 | B2 | 7/2005 | Murakawa et al. |
| 7,879,179 | B2 | 2/2011 | Otsuki |
| 2002/0086554 | A1 * | 7/2002 | O'Donnell et al. ........... 438/780 |

FOREIGN PATENT DOCUMENTS

| | | |
|---|---|---|
| EP | 0691420 A1 | 1/1996 |
| EP | 0859070 A1 | 8/1998 |
| JP | A S63-100065 | 5/1988 |
| JP | AH03-290384 | 12/1991 |
| JP | 4-191379 A | 7/1992 |
| JP | 8-81790 A | 3/1996 |
| JP | 09295863 | 11/1997 |
| JP | 10-004083 | 1/1998 |
| JP | 10-045461 | 2/1998 |
| JP | 10067554 | 3/1998 |
| JP | 11-219937 A | 8/1999 |
| JP | 2000086344 A | 3/2000 |
| JP | 2000-114189 A | 4/2000 |
| JP | 2000-302553 A | 10/2000 |
| JP | 2000313658 A | 11/2000 |
| JP | 2001-164354 | 6/2001 |
| JP | 2001207275 A | 7/2001 |
| JP | 2001-240482 | 9/2001 |
| JP | 2001-284328 | 10/2001 |
| JP | 2001-295075 | 10/2001 |
| JP | 2002-037683 | 2/2002 |
| WO | WO91/17839 | 11/1991 |
| WO | WO00/07216 | 2/2000 |

OTHER PUBLICATIONS

Official English translation of JP 04-191379A. Obtained Mar. 2013 from Schreiber Translations, Inc.*
Korean Official Action issued Jul. 27, 2010 for Korean Appln. No. 2004-7014822.
Japanese Official Action mailed Jul. 2, 2010 for Japanese Appln. No. 2003-578613.
Official English Translation of JP 2001-207275A to Ito.
Lech Pawlowski, "The Science and Engineering of Thermal Spray Coatings" (John Weley, 1995).
W.D. Kingery, H.K. Bowen and D. R. Ulmann (John Wiley & Sons, 1976) "Introduction to Ceramics", $2^{nd}$ Edition.
Notification of Transmittal of the International Search Report or the Declaration for PCT/US03/04061 dated Jul. 3, 2003.
Written Opinion for PCT/US03/04061 dated Nov. 10, 2003.
English Machine Translation of JP 2001207275A to Ito. Obtained from http://www.19.ncipi.go.jp/PA1/cgi-bin/PA1DETAIL on Oct. 2, 2006.
Utility U.S. Appl. No. 12/230,413, filed Aug. 28, 2008.
Korean Official Action issued Jan. 28, 2010 for Korean Patent Appln. No. 2004-7014822.
Japanese Official Action mailed Aug. 3, 2009 for Japanese Appln. No. 2003-578613.
Japanese Official Action mailed Dec. 12, 2011for Japanese Appln. No. 2003-578613.
Official Action mailed Jan. 7, 2013 for Japanese Patent Appln. No. 2010-014638.

* cited by examiner

LOW CONTAMINATION COMPONENTS FOR SEMICONDUCTOR PROCESSING APPARATUS AND METHODS FOR MAKING COMPONENTS

This application is a divisional application of U.S. application Ser. No. 12/230,413 entitled LOW CONTAMINATION COMPONENTS FOR SEMICONDUCTOR PROCESSING APPARATUS AND METHODS FOR MAKING COMPONENTS, filed on Aug. 28, 2008 which is a continuation of U.S. application Ser. No. 10/837,575 entitled LOW CONTAMINATION COMPONENTS FOR SEMICONDUCTOR PROCESSING APPARATUS AND METHODS FOR MAKING COMPONENTS, filed on May 4, 2004 which is a divisional application of U.S. application Ser. No. 10/101,701 entitled LOW CONTAMINATION COMPONENTS FOR SEMICONDUCTOR PROCESSING APPARATUS AND METHODS FOR MAKING COMPONENTS, filed on Mar. 21, 2002, the entire content of each is hereby incorporated by reference.

BACKGROUND OF THE INVENTION

1. Field of the Invention

The invention relates to components for semiconductor material processing equipment. The components are formed of materials that can reduce contamination during semiconductor material processing. The invention also relates to methods of making the components.

2. Description of the Related Art

In the field of semiconductor material processing, vacuum processing chambers are used for etching and chemical vapor deposition (CVD) of materials on substrates. Process gases are flowed into the processing chamber while a radio frequency (RF) field is applied to the process gases to generate a plasma of the process gases. The plasma performs the desired etching or deposition of selected materials on wafers. Examples of parallel plate, transformer coupled plasma (TCP™), which is also called inductively coupled plasma (ICP), and electron-cyclotron resonance (ECR) reactors and components thereof are disclosed in commonly owned U.S. Pat. Nos. 4,340,462; 4,948,458; 5,200,232 and 5,820,723.

During processing of semiconductor substrates, the substrates are typically held in place within the vacuum chamber by substrate holders, as disclosed, for example, in U.S. Pat. Nos. 5,262,029 and 5,838,529. Process gas can be supplied to the chamber by various gas supply systems.

In addition to the plasma chamber equipment, other equipment used in processing semiconductor substrates includes transport mechanisms, liners, lift mechanisms, load locks, door mechanisms, robotic aims, fasteners, and the like.

Plasmas are used to remove materials by etching or for deposition of materials on substrates. The plasma etch conditions create significant ion bombardment of the surfaces of the processing chamber that are exposed to the plasma. This ion bombardment, combined with plasma chemistries and/or etch byproducts, can produce significant erosion, corrosion and corrosion-erosion of the plasma-exposed surfaces of the processing chamber. As a result, the surface materials are removed by physical and/or chemical attack, including erosion, corrosion and/or corrosion-erosion. This attack causes problems including short part-lifetimes, increased consumable costs, particulate contamination, on-wafer transition metal contamination and process drift.

In light of these problems, plasma processing chambers have been designed to include parts, such as, disks, rings, and cylinders, that confine the plasma over the wafer being processed. However, these parts are continuously attacked by the plasma and, consequently, ultimately erode or accumulate polymer buildup. Eventually, these parts suffer such wear that they are no longer usable. Those parts with relatively short lifetimes are commonly referred to as "consumables." If the consumable part's lifetime is short, then the cost of ownership is high. Erosion of consumables and other parts generates contamination in plasma processing chambers.

Because of the erosive and corrosive nature of the plasma environment in such reactors, and the need to minimize particle and/or metal contamination, it is desirable for components of such equipment, including consumables and other parts, to have suitably high erosion and corrosion resistance. Known parts have been formed of aluminum-based materials. However, the high ion bombardment by the plasma can erode and corrode these materials, producing unsatisfactory levels of contamination (e.g., particulate contamination and metallic impurity contamination).

In view of the high purity requirements for processing semiconductor materials there is a need for components of semiconductor processing apparatus composed of materials that provide improved resistance to physical and chemical attack, including erosion, corrosion and/or erosion-corrosion, to minimize the associated contamination of semiconductor materials during their processing. Materials that can increase the service life of components of the equipment and thus reduce the down time of the apparatus, would contribute to reducing the cost of processing semiconductor materials.

SUMMARY OF THE INVENTION

The invention can satisfy the above-described needs, as well as other needs, by providing components of semiconductor processing apparatus composed of ceramic materials that provide improved wear resistance to erosion, corrosion and/or corrosion-erosion in plasma processing environments. The components can provide low contamination with respect to metals and particulate.

In accordance with exemplary embodiments of the invention, the ceramic materials can be applied as coatings on surfaces of substrates, in components utilized in semiconductor material processing equipment. For example, the components can be used in plasma processing chambers. The coated components can provide improved resistance to erosion, corrosion and/or corrosion-erosion when exposed to plasmas during processing.

In accordance with other exemplary embodiments of the invention, such components can be bulk parts formed entirely of the protective materials. That is, the components can be monolithic.

An exemplary embodiment of a process of making a component of a semiconductor processing apparatus according to the invention comprises forming at least a portion of a component of such equipment from a ceramic material. The portion comprises an outermost surface of the component. The ceramic material comprises (i) at least one oxide, nitride, boride, carbide and/or fluoride of (ii) strontium, lanthanum and dysprosium, and/or at least one nitride, boride, carbide and/or fluoride of hafnium. Preferably, the ceramic material comprises one of strontium oxide, dysprosium oxide and lanthanum oxide as the single largest constituent of the ceramic material coating. The ceramic material can be applied as a coating, or it can be formed into a monolithic body.

Another exemplary embodiment of the invention comprises applying a coating of a ceramic material over a metal containing or polymeric surface of a component of a semiconductor processing apparatus. The ceramic material comprises hafnium oxide, hafnium nitride, hafnium boride, hafnium carbide or hafnium fluoride as the single largest constituent of the ceramic material coating.

Other exemplary embodiment of methods according to the invention comprise forming a component of a semiconductor processing apparatus in the form of a monolithic body. The component comprises hafnium oxide, hafnium nitride, hafnium boride, hafnium carbide or hafnium fluoride as the single largest constituent.

An exemplary embodiment of a process of making a component of a semiconductor processing apparatus according to the invention comprises preparing a slurry comprising as the single largest constituent (i) at least one oxide, nitride, boride, carbide and/or fluoride of (ii) strontium, lanthanum and dysprosium, and/or at least one nitride, boride, carbide and/or fluoride of hafnium; forming a green compact from the slurry in the desired shape; and sintering the green compact to form a component. The ceramic material preferably comprises at the least one of hafnium. oxide, strontium oxide, dysprosium oxide and lanthanum oxide as the single largest constituent thereof These processes can be used to form monolithic components.

An exemplary embodiment of a component of a semiconductor processing apparatus according to the invention comprises at least a portion comprising a ceramic material. The portion comprises an outermost surface of the component. The ceramic material comprises as the single largest constituent (i) at least one oxide, nitride, boride, carbide and/or fluoride of (ii) strontium, lanthanum and dysprosium, and/or at least one nitride, boride, carbide and/or fluoride of hafnium.

Another exemplary embodiment of a component of a semiconductor processing apparatus according to the invention comprises a substrate having a metal containing or polymeric surface; and a coating of a ceramic material over the surface, where the ceramic material comprises hafnium oxide, hafnium nitride, hafnium boride, hafnium carbide or hafnium fluoride as the single largest constituent of the ceramic material coating.

Another exemplary embodiment of a component of a semiconductor processing apparatus according to the invention comprises a monolithic body, which comprises hafnium oxide, hafnium nitride, hafnium boride, hafnium carbide or hafnium fluoride as the single largest constituent.

The invention also provides semiconductor processing apparatus that includes at least one of above-described components to provide wear resistance.

BRIEF DESCRIPTION OF THE DRAWINGS

The invention will be readily understood by the following detailed description in conjunction with the accompanying drawings.

DETAILED DESCRIPTION OF THE PREFERRED EMBODIMENTS

Figure 1:
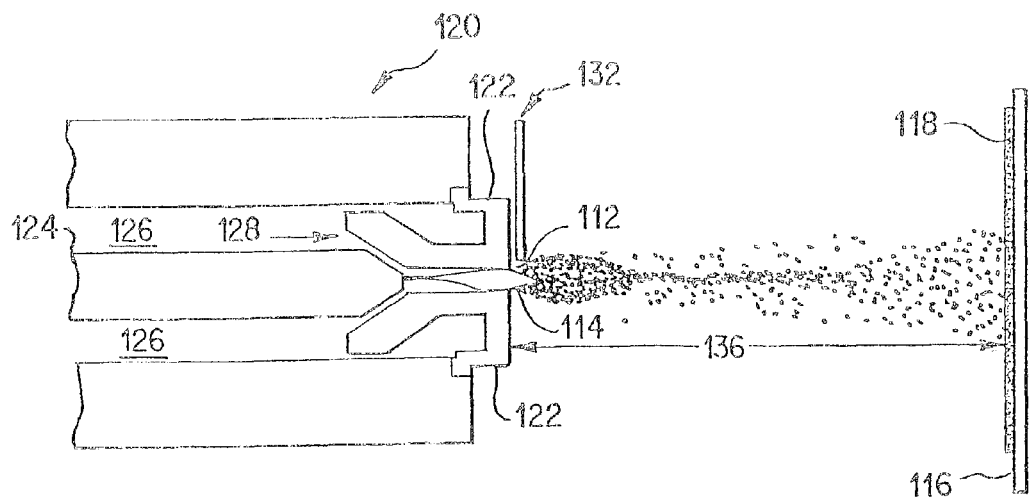
FIG. 1 illustrates a conventional plasma spray process.

The invention provides components that have wear resistance with respect to physical and chemical attack by plasmas generated in semiconductor material processing apparatuses. As used herein, the term "wear resistant" includes, but is not limited to, erosion, corrosion and/or corrosion-erosion resistance. The components are composed of wear resistant ceramic materials.

In some exemplary embodiments, the components include coatings composed of erosion resistant ceramic materials formed on substrates. For example, the components can include substrates and one or more erosion resistant ceramic coatings formed on the substrates. The coatings resist erosion and, being non-metallic materials, are also resistant to corrosion and/or corrosion-erosion.

In other exemplary embodiments of the invention, the components can consist essentially of wear resistant ceramic materials. For example, the components can be bulk parts of a semiconductor material processing apparatus.

According to the invention, the components composed of the wear resistant ceramic materials can be components of apparatuses for processing semiconductors.

The invention also provides semiconductor processing apparatuses that include one or more of the components composed, at least partially, of a wear resistant material.

In addition, the invention provides methods of making components, at least in part, of the wear resistant materials.

As stated above, the invention is applicable to any suitable type of component. The invention provides effective wear resistance to the surfaces of components of semiconductor material processing apparatuses. Those skilled in the art will appreciate that the wear resistant materials according to the invention can be applied to different processing apparatuses useful for processing different semiconductor materials. In addition, the wear resistant materials can be applied to different components in the processing apparatuses. Such exemplary components include, but are not limited to, parts of a plasma and/or vacuum chamber, such as, for example, chamber walls, substrate supports, gas distribution systems including showerheads, baffles, rings, nozzles, etc., fasteners, heating elements, plasma screens, liners, transport module components, such as robotic arms, fasteners, inner and outer chamber walls, and the like.

According to the invention, the wear resistant materials can comprise at least one of hafnium, strontium, dysprosium and lanthanum. These elements have a relatively large molecular mass and are relatively inert with respect to typical etching chemicals, which are believed to provide a reduced erosion rate in plasma environments. Preferably, the wear resistant materials comprise one of hafnium oxide, strontium oxide, dysprosium oxide or lanthanum oxide as the single largest constituent of the ceramic material. Exemplary embodiments of the ceramic materials can comprise any one or more of these oxides. Other constituents that can be included in the ceramic materials are described in detail below.

The hafnium containing ceramic materials according to the invention preferably contain hafnium oxide (hafnium) as the single largest constituent. In some embodiments, the hafnium containing ceramic materials can consist essentially of hafnium oxide. The hafnium containing ceramic materials can also contain other hafnium containing ceramic materials other than oxides, including, but not limited to, at least one hafnium boride, hafnium fluoride, hafnium nitride and/or hafnium carbide, or mixtures thereof.

According to the invention, the hafnium containing ceramic materials can contain other ceramic materials other than, or in addition to, the above-described hafnium oxide, boride, fluoride and carbide materials. These other ceramic materials can include, but are not limited to, at least one oxide, nitride, boride, fluoride and/or carbide of elements selected from Groups IIA, IIIA, IVA, VA, VIA, VIIA, VIIIA, IB, IIB, IIIB, IVB and VB of the periodic table; and/or one or more oxide, nitride, boride, fluoride or carbide of any element of the lanthanide series (i.e., elements having an atomic number of 58-71). For example, hafnium containing ceramic materials (and also strontium containing, dysprosium containing and lanthanum containing materials described below) can be mixed with yttrium oxide (yttria), zirconium oxide (zirconia), aluminum oxide (alumina) and/or cerium oxide (ceria).

The strontium containing ceramic materials according to the invention preferably contain strontium oxide (strontia) as the single largest constituent. In some embodiments, the strontium containing ceramic materials can consist essentially of strontium oxide. The strontium containing ceramic materials can also contain other strontium containing ceramic materials other than oxides, including, but not limited to, at least one strontium boride, strontium fluoride, strontium nitride, strontium carbide, or mixtures thereof.

According to the invention, the strontium containing ceramic materials can contain other ceramic materials other than, or in addition to, the above-described strontium oxide, boride, fluoride and carbide materials. These other ceramic materials can include, but are not limited to, one or more oxides, nitrides, borides, fluorides and carbides of elements selected from Groups IIA, IIIA, IVA, VA, VIA, VIIA, VIIIA, IB, IIB, IIIB, IVB, and VB of the periodic table; and/or one or more oxide, nitride, boride, fluoride or carbide of any element of the lanthanide series, as described above.

The dysprosium containing ceramic materials according to the invention preferably contain dysprosium oxide (dysprosia) as the single largest constituent. In some embodiments, the dysprosium containing ceramic materials can consist essentially of dysprosium oxide. The dysprosium containing ceramic materials can also contain other dysprosium containing ceramic materials other than oxides, including, but not limited to, at least one dysprosium boride, dysprosium fluoride, dysprosium nitride, dysprosium carbide, or mixtures thereof.

According to the invention, the dysprosium containing ceramic materials can contain other ceramic materials other than, or in addition to, the above-described dysprosium oxide, boride, fluoride and carbide materials. These other ceramic materials can include, but are not limited to, at least one oxide, nitride, boride, fluoride and/or carbide of elements selected from Groups IIA, IIIA, IVA, VA, VIA, VIIA, VIIIA, IB, IIB, IIIB, IVB and VB of the periodic table; and/or one or more oxide, nitride, boride, fluoride or carbide of any element of the lanthanide series, as described above.

The lanthanum containing ceramic materials according to the invention preferably contain lanthanum oxide (lanthana) as the single largest constituent. In some embodiments, the lanthanum containing ceramic materials can consist essentially of lanthanum oxide. The lanthanum containing ceramic materials can also contain other lanthanum containing ceramic materials other than oxides, including, but not limited to, at least one lanthanum boride, lanthanum fluoride, lanthanum nitride and/or lanthanum carbide, or mixtures thereof.

According to the invention, the lanthanum containing ceramic materials can contain other ceramic materials other than, or in addition to, the above-described lanthanum oxide, boride, fluoride and carbide materials. These other ceramic materials can include, but are not limited to, at least one oxide, nitride, boride, fluoride and/or carbide of elements selected from Groups IIA, IIIA, IVA, VA, VIA, VIIA, VIIIA, IB, IIB, IIIB, IVB, and VB of tie periodic table; and/or at least one oxide, nitride, boride, fluoride and/or carbide of any element of the lanthanide series, as described above.

According to the invention, the ceramic materials can comprise mixtures of the above-described hafnium, strontium, dysprosium and lanthanum containing materials. In addition, the ceramic materials can comprise mixtures of hafnium, strontium, dysprosium and/or lanthanum containing materials, and additional materials, including, but not limited to, one or more oxides, nitrides, borides, fluorides and carbides of elements selected from Groups IIA, IIIA, IVA, VA, VIA, VIIA, VIIIA, IB, IIB, IIIB, IVB, and VB; and/or one or more oxide, nitride, boride, fluoride or carbide of any element of the lanthanide series, as described above.

In order to try to minimize the contamination of electronic materials processed in equipment incorporating one or more hafnium, strontium, dysprosium and/or lanthanum containing components according to the invention, it is desirable for the ceramic materials to be as pure as possible, e.g., include minimal amounts of potentially contaminating elements, such as transition metals, alkali metals or the like. For example, the hafnium, strontium, dysprosium and lanthanum containing ceramic materials can be sufficiently pure to avoid on-wafer contamination of $10^{10}$ atoms/cm$^2$ or higher, preferably $10^5$ atoms/cm$^2$ or higher. Preferably, these ceramic materials have a purity of at least about 99%, and more preferably from about 99.99% to about 100%.

In addition, the hafnium, strontium, dysprosium and lanthanum containing ceramic materials according to the invention have a smooth surface finish. Preferably, these materials, applied as coatings or formed into monolithic components, have a surface roughness (RA) of from about 5 to about 400 μinch, and more preferably less than about 200 μinch.

The hafnium, strontium, dysprosium and lanthanum containing ceramic materials according to the invention can also provide a high bond strength to the underlying substrate. Preferably, these materials applied as coatings have a tensile bond strength of from about 2000 psi to about 7000 psi.

Also, the hafnium, strontium, dysprosium and lanthanum containing ceramic materials according to the invention can provide low porosity levels, which is advantageous to minimize contact of aggressive atmospheres (e.g., HCl containing atmospheres) with the underlying substrate, and thus subsequent corrosion, erosion and/or corrosion-erosion of the substrate by the aggressive atmosphere. Preferably, the ceramic materials have a porosity of less than 15% by volume, and more preferably less than about 3% by volume.

In addition, the hafnium, strontium, dysprosium and lanthanum containing ceramic materials according to the invention can provide a high hardness to resist erosion. Preferably, the ceramic materials have a hardness (HVO$_3$) of from about 200 to about 800.

The above-described ceramic materials can provide desirable wear resistance properties for use in semiconductor processing apparatus, such as, for example, plasma etch chambers. In particular, hafnium, strontium, dysprosium and lanthanum containing ceramic materials can provide surfaces that can reduce ion induced erosion and associated levels of particulate contamination in plasma reactor chambers. hafnium, strontium, dysprosium and lanthanum containing ceramic materials can also protect underlying substrates against both physical attack and chemical attack by plasmas.

The wear resistant ceramic materials according to the invention can be -used in various different plasma atmospheres for etching and deposition applications, as well as other uses. For example, typical etch chemistries include, for example, chlorine containing gases including, but not limited to, $Cl_2$, HCl and $BCl_3$; bromine containing gases including, but not limited to, bromine and HBr; oxygen containing gases including, but not limited to, $O_2$, $H_2O$ and $SO_2$; fluorine containing gases including, but not limited to, $CF_4$, $CH_2F_2$, $NF_3$, $CH_3F$, $CHF_3$ and $SF_6$; and inert and other gases including, but not limited to He, Ar and $N_2$. These and other gases may be used in any suitable combination, depending on the desired plasma. Exemplary plasma reactor etching operating conditions are as follows: temperature of from about 25° C. to about 90° C.; pressure of from about 0 mTorr to about 100 mTorr; gas flow rate of from about 10 sccm to about 1000 sccm; and plasma power of from about 0 Watts to about 1500 Watts.

In an exemplary preferred embodiment of the invention, the hafnium, strontium, dysprosium and lanthanum containing ceramic materials are provided as a coating on a substrate. These coatings can be applied by methods known in the art. A preferred coating method is thermal spraying (e.g., plasma splaying). In this method, ceramic powder is melted and incorporated in a gas stream, which is directed at the component being spray coated. An advantage of thermal spraying techniques is that the component is coated only on the sides facing the thermal spray gun, and masking can be used to protect other areas. Conventional thermal spraying techniques, including plasma spraying, are described in *The Science and Engineering of Thermal Spray Coating* by Pawlowski (John Wiley, 1995). This description is hereby incorporated by reference in its entirety.

A particularly preferred thermal spraying method is plasma spraying. Plasma spraying can be used to coat even intricate interior surfaces of chambers and other chamber components. FIG. 1 illustrates a typical plasma spraying process. The coating material, usually in the form of a powder 112, is injected into a high temperature plasma flame 114 usually via an external powder port 132 The powder is rapidly heated and accelerated to a high velocity. The hot material impacts on the substrate surface 116 and rapidly cools to form a coating 118.

The plasma spray gun 120 comprises an anode 122 and a cathode 124, both of which are water cooled. Plasma gas 126 (e.g., argon, nitrogen, hydrogen, helium) flows around the cathode in the direction generally indicated by arrow 128 and through a constricting nozzle of the anode. The plasma is initiated by a high voltage discharge, which causes localized ionization and a conductive path for a DC arc to form between the cathode 124 and the anode 122. Resistance heating from the arc causes the gas to form a plasma. The plasma exits the anode nozzle portion as a free or neutral plasma flame (plasma which does not carry electric current). When the plasma is stabilized ready for spraying, the electric arc extends down the nozzle. The powder 112 is so rapidly heated and accelerated that the spray distance 136 between the nozzle tip and the substrate surface can be on the order of 125 to 150 mm. Plasma sprayed coatings are produced by molten or heat-softened particles caused to impact on the substrate surface 116.

According to the invention, surface treating techniques, such as cleaning and particle blasting can be used to provide a more chemically and physically active surface for bonding. Prior to coating, the surface of the substrate is preferably thoroughly cleaned to remove undesirable surface material, such as oxides or grease. The surface can also be roughened by any suitable method, such as grit blasting, prior to coating. This roughening increases the surface area available for bonding, which increases the coating bond strength. The rough surface profile can also promote mechanical keying or interlocking of the coating with the substrate.

For aluminum reactor components, it is preferable to anodize the surface of the component that is to be coated prior to coating, but not roughen the anodized surface. The anodized layer provides an additional barrier, i.e. in addition to protection provided by the coating, against corrosive attack of the underlying aluminum. The anodized aluminum layer formed on aluminum substrates, such as 6061-T6 aluminum, can have any suitable thickness. For example, the thickness can be typically be from about 2 mil to about 10 mil. The anodized surface can have any suitable finish. For example, the surface finish can have an RA value of about 20 μinch to about 100 μinch. The anodized layer call be sealed by any suitable technique, such as by using boiling deionized water.

Hafnium oxide, strontium oxide, dysprosium oxide and/or lanthanum oxide containing ceramic materials according to the invention are preferably applied using a plasma spray process. However, any other coating method suitable for use with ceramic materials may also be employed. For example, the hafnium oxide, strontium oxide, dysprosium oxide and/or lanthanum oxide containing ceramic coatings can also be applied by sputtering, sputter deposition, immersion coating, chemical vapor deposition, evaporation and condensation (including election beam evaporation and condensation), physical vapor deposition, hot isostatic pressing, cold isostatic pressing, compression molding, casting, compacting and sintering, and thermal spraying.

Figure 2:
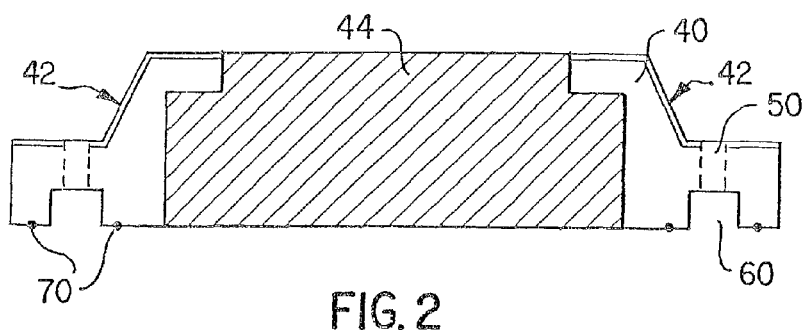
FIG. 2 shows a cross-sectional view of a gas ring for a plasma etching apparatus according to an exemplary embodiment of the invention.

In some preferred embodiments of the invention, the hafnium, strontium, dysprosium and/or lanthanum containing ceramic components are used in a high-density plasma reactor. An exemplary reactor of this type is the TCP 9400™ plasma etch reactor available from Lam Research Corporation of Fremont, Calif. In the TCP 9400™ reactor, processing gases (such as $Cl_2$, HBr, $CF_4$, $CH_2F_2$, $O_2$, $N_2$, Ar, $SF_6$ and $NF_3$) are conducted into a gas ring located at the bottom of the etch chamber and are then guided through gas holes into the reactor chamber. FIG. 2 shows a gas ring for a TCP 9400™ etch reactor. As shown in FIG. 2, the main body of the gas ring 40 surrounds a substrate support 44. The bottom surface of the gas ring 40 contains a ring-shaped gas-guiding trench 60. The aforementioned gas holes 50 extend into the gas-guiding trench 60.

The gas ring 40 is typically composed of aluminum. Upper surfaces of the gas ring are directly exposed to the plasma and thus subject to erosion, corrosion and corrosion-erosion. To protect these surfaces, the gas ring is typically covered with an aluminum oxide layer. This layer is, however, relatively brittle and can crack during repeated thermal cycling of the reactor during use. Cracks that form in the anodized layer can allow the corrosive process gases to attack the underlying aluminum layer, reducing part life and contributing to metallic and particle contamination of processed substrates, such as wafers, flat panel display substrates and the like.

According to exemplary embodiments of the invention, the exposed surfaces of the gas ring can be covered with a coating 42 of a hafnium, strontium, dysprosium and/or lanthanum containing ceramic material. The ceramic materials can be coated on a bare (with or without a native oxide surface film) aluminum layer or on an aluminum oxide layer (e.g., aluminum having an anodized surface). When coating the gas ring, the coating can be allowed to partially penetrate into the gas holes to coat and protect the inside walls thereof, but without obstructing the openings. For example, the gas holes can be plugged or masked during the coating process.

Other components of the TCP 9400™ etch reactor that can be exposed to the plasma during processing can also be coated with a hafnium, strontium, dysprosium and/or lanthanum containing ceramic material according to the invention. These components include, for example, chamber walls, chamber liners, chucking devices and the dielectric window opposite the substrate. Providing a coating according to the invention on the upper surface of a chucking device, such as an electrostatic chuck, provides additional protection to the chuck during cleaning cycles in which a wafer is not present and the upper surface of the chuck is thus directly exposed to the plasma.

Figure 3:
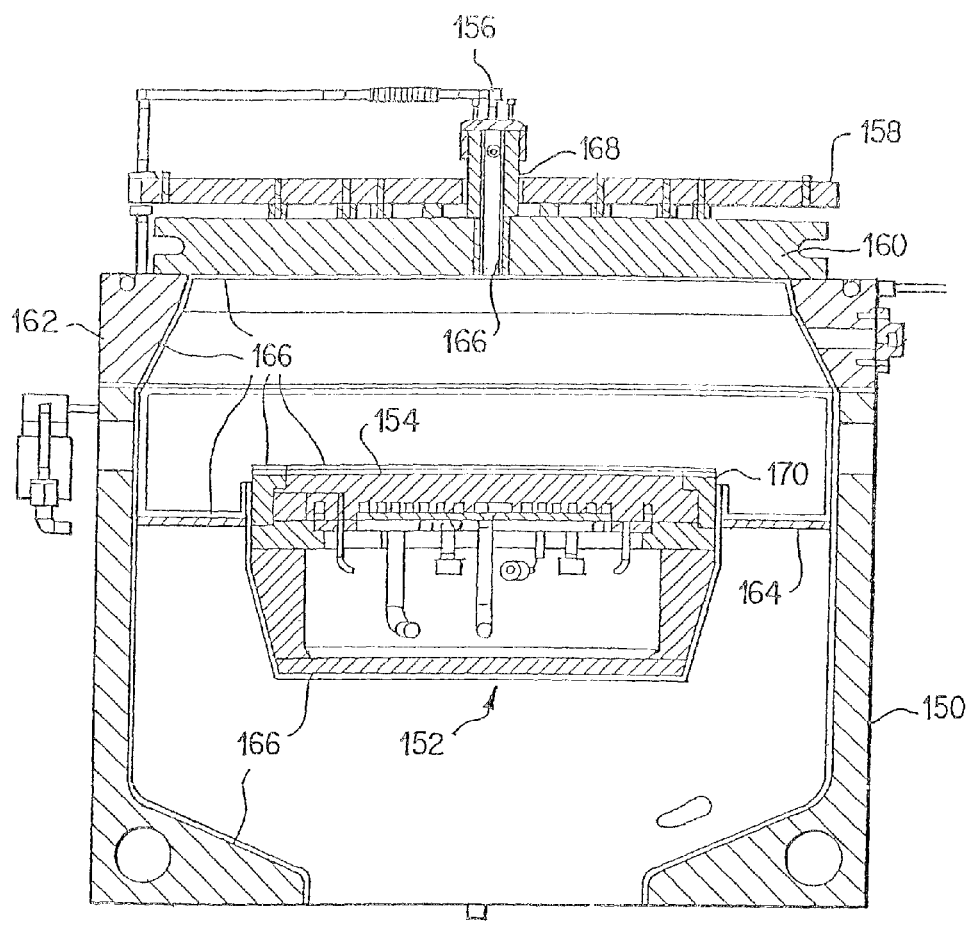
FIG. 3 shows an etch chamber containing exemplary embodiments of components according to the invention.

Another exemplary polysilicon etch reactor that can include the hafnium, strontium, dysprosium and/or lanthanum containing ceramic materials according to the invention is the Versys™ Polysilicon Etcher or 2300™ etcher also available from Lam Research Corporation of Fremont, Calif., as shown in FIG. 3. The reactor comprises a reactor chamber 150 that includes a substrate support 152 including an electrostatic chuck 154, which provides a clamping force to a substrate (not shown) mounted thereon. A focus ring 170 is mounted on the substrate support 152 around the electrostatic chuck 154. The substrate support 152 can also be used to apply an RF bias to the substrate. The substrate can also be back-cooled rising a heat transfer gas such as helium. In the 2300™ etcher, processing gases (e.g., $Cl_2$, HBr, $CF_4$, $CH_2F_2$, $O_2$, $N_2$, Ar, $SF_6$ or $NF_3$) are introduced into the chamber 150 via a gas injector 168 located on the top of chamber 150 and connected to a gas feed 156. The gas injector 168 is typically made of quartz or a ceramic material such as alumina. As shown, an inductive coil 158 can be powered by a suitable RF source (not shown) to provide a high density (e.g., $10^{11}$-$10^{12}$ ions/$cm^3$) plasma. The inductive coil 158 couples RF energy through dielectric window 160 into the interior of chamber 150. The dielectric window 160 is typically made of quartz or alumina. The dielectric window 160 is shown mounted on an annular member 162. The annular member 162 spaces dielectric window 160 from the top of chamber 150 and is referred to as a "gas distribution plate". A chamber liner 164 surrounds the substrate support 152. The chamber 150 can also include suitable vacuum pumping apparatus (not shown) for maintaining the interior of the chamber at a desired pressure.

In FIG. 3, selected internal surfaces of reactor components, such as the annular member 162, dielectric window 160, substrate support 152, chamber liner 164, gas injector 168, focus ring 170 and the electrostatic chuck 154, are shown coated with a coating 166 of a hafnium, strontium, dysprosium and/or lanthanum containing ceramic material according to the invention. As shown in FIG. 3, selected interior surfaces of the chamber ISO and substrate support 152 below the chamber liner 164 can also be provided with a coating 166 of a hafnium, strontium, dysprosium and/or lanthanum containing ceramic material according to the invention. Any or all of these surfaces, as well as any other internal reactor surface, can be provided with a coating according to the invention. As described below, any or all of these components can alternatively be manufactured from monolithic bodies of a hafnium, strontium, dysprosium and/or lanthanum containing ceramic material according to the invention.

According to the invention, the components can be used in a high-density oxide etch process. An exemplary oxide etch reactor is the TCP 9100™ plasma etch reactor available from Lam Research Corporation of Premont, Calif. In the TCP 9100™ reactor, the gas distribution plate is a circular plate situated directly below the TCP™ window, which is also the vacuum sealing surface at the top of the reactor in a plane above and parallel to a semiconductor wafer. The gas distribution plate is sealed to a gas distribution ring located at the periphery of the gas distribution plate. The gas distribution ring feeds gas from a source into the volume defined by the gas distribution plate, an inside surface of a window underlying an antenna in the form of a flat spiral coil supplying RF, energy into the reactor, and the gas distribution ring. The gas distribution plate contains holes of a specified diameter, which extend through the plate. The spatial distribution of the holes through the gas distribution plate can be varied to optimize etch uniformity of the layers to be etched, e.g., a photoresist layer, a silicon dioxide layer and an underlayer material on the wafer. The cross-sectional shape of the gas distribution plate can be varied to manipulate the distribution of RF power into the plasma in the reactor. The gas distribution plate is a dielectric material to enable coupling of this RF power through the gas distribution plate into the reactor. Further, it is desirable for the material of the gas distribution plate to be highly resistant to chemical sputter-etching in environments, such as oxygen or a hydro-fluorocarbon gas plasma, to avoid breakdown and the resultant particle generation associated therewith.

Figure 4:
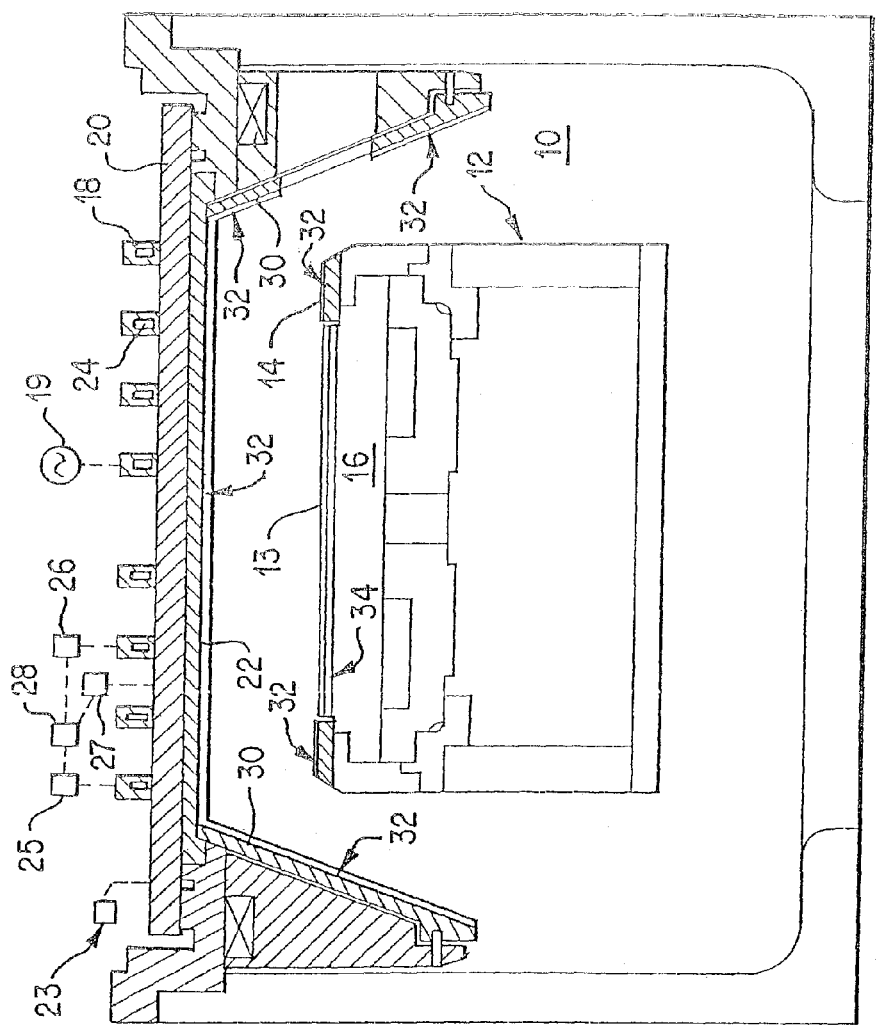
FIG. 4 shows another etch chamber containing exemplary embodiments of components according to the invention.

FIG. 4 illustrates a plasma reactor of the aforementioned type. The reactor comprises a reactor chamber 10. A substrate holder 12 includes an electrostatic chuck 34, which provides a clamping force and an RF bias to a substrate 13, The substrate can be back-cooled using a heat transfer gas such as helium. A focus ring 14 confines plasma in a region above the substrate. A source of energy for maintaining a high density (e.g., $10^{10}$-$10^{12}$ ions/$cm^3$) plasma in the chamber, such as an antenna 18 powered by a suitable RF source to provide a high density plasma, is disposed at the top of the reactor chamber 10. The reactor chamber includes a vacuum pumping apparatus for maintaining the interior of the chamber at a desired pressure (e.g., below 50 mTorr, typically 1-20 mTorr).

A substantially planar dielectric window 20 is provided between the antenna 18 and the interior of the processing chamber 10 and forms the vacuum wall at the top of the processing chamber 10. A gas distribution plate 22 is provided beneath window 20 and includes openings for delivering process gas from the gas supply 23 to the chamber 10. A conical liner 30 extends from the gas distribution plate 22 and surrounds tie substrate holder 12. The antenna 18 can be provided with a channel 24 through which a temperature control fluid is flowed via inlet and outlet conduit 25, 26. However, the antenna 18 and/or window 20 need not be cooled, or could be cooled by other suitable technique, such as by blowing gas over the antenna and window, passing a cooling fluid through or in heat transfer contact with the window and/or gas distribution plate, etc.

In operation, a substrate, such as a semiconductor wafer, is positioned on the substrate holder 12 and held in place by an electrostatic chuck 34. Other clamping means, however, such as a mechanical clamping mechanism can also he used. Additionally, helium back-cooling can be employed to improve heat transfer between the substrate and chuck. Process gas is then supplied to the vacuum processing chamber 10 by passing the process gas through a gap between the window 20 and the gas distribution plate 22. Suitable gas distribution plate arrangements (i.e., showerhead) arrangements are disclosed in commonly owned U.S. Pat. Nos. 5,824,605; 6,048,798; and 5,863,376, each of which is incorporated herein by reference in its entirety. A high density plasma is ignited in the space between the substrate and the window by supplying suitable RF power to the antenna 18.

In FIG. 4, the internal surfaces of reactor components, such as the gas distribution plate 22, the chamber liner 30, the electrostatic chuck 34, and the focus ring 14 are coated with a coating 32 of a hafnium, strontium, dysprosium and/or lanthanum containing ceramic material according to the invention. However, only selected ones of these surfaces, and/or other surfaces, can be coated with a hafnium, strontium, dysprosium and/or lanthanum containing ceramic material according to the invention.

Those skilled in the art will appreciate that the high density polysilicon and dielectric etch chambers described above are only exemplary embodiments of plasma etch reactors that can incorporate components according to the invention. Components containing hafnium, strontium, dysprosium and/or lanthanum containing ceramic materials according to the invention can be used in any etch reactor (e.g., a metal etch reactor) or other type of semiconductor processing apparatus where the reduction of plasma induced erosion, corrosion and/or corrosion-erosion and associated contamination is desired.

For example, other components that can be provided with a coating of a hafnium, strontium, dysprosium and/or lanthanum containing ceramic material according to the invention include, but are not limited to, chamber walls, substrate holders, fasteners, etc. These parts are typically made from metal (e.g., aluminum) or ceramic (e.g., alumina). These metallic plasma reactor components are typically exposed to plasma and often show signs of erosion, corrosion and/or corrosion-erosion. Other parts that can be coated in accordance with the invention need not be directly exposed to plasma, but may instead be exposed to corrosive gases, such as gases emitted from processed wafers or the like. Therefore, other equipment used in processing semiconductor substrates can also be provided with hafnium, strontium, dysprosium and/or lanthanum containing ceramic material surfaces and coatings according to the invention. Such equipment can include transport mechanisms, gas supply systems, liners, lift mechanisms, load locks, door mechanisms, robotic arms, fasteners, and the like.

Examples of metallic materials that can be coated with a hafnium, strontium, dysprosium and/or lanthanum containing ceramic material according to the invention include aluminum and aluminum alloys, stainless steels and refractory metals, e.g., 6061-T6 aluminum and 304 and 316 stainless steels. Because the hafnium, strontium, dysprosium and/or lanthanum containing ceramic materials form a wear resistant coating over the component, the underlying component is protected from direct exposure to the plasma. Accordingly, the metallic substrate can be protected against erosion, corrosion and/or corrosion-erosion attack by the plasma. As a result, metallic materials, such as aluminum alloys, can be used without regard to alloying additions, grain structure of surface conditions.

In addition, various ceramic or polymeric materials can also be coated with a hafnium, strontium, dysprosium and/or lanthanum containing ceramic material according to the invention. In particular, the reactor components can be made from ceramic materials, including, but not limited to, alumina ($Al_2O_3$), silicon carbide (SiC), silicon nitride ($Si_3N_4$), boron carbide ($B_4C$) and/or boron nitride (BN). Polymeric materials that can be coated are preferably those that can withstand high temperature conditions present in plasma reactors.

Figure 5:
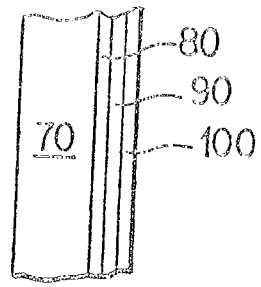
FIG. 5 shows an exemplary embodiment of a protective ceramic coating according to the invention.

If desired, one or more intermediate layers of material can be provided between the surface of the substrate that is coated and the hafnium, strontium, dysprosium and/or lanthanum containing ceramic material coating. FIG. 5 shows a coated component according to an exemplary preferred embodiment of the invention. A first intermediate coating 80 is optionally coated on a substrate 70 by a conventional technique. The optional first intermediate coating 80 is sufficiently thick to adhere to the substrate and to further allow it to be processed prior to forming an optional second intermediate coating 90, or the hafnium, strontium, dysprosium and/or lanthanum containing ceramic material coating 100. The first intermediate coating 80 and the second intermediate coating 90 can have any suitable thickness that provides these desired properties. These coatings can have a thickness of at least about 0.001 inches, preferably from about 0.001 to about 0.25 inches, more preferably from about 0.001 to about 0.15 inches, and most preferably from about 0.001 inches to about 0.05 inches.

After depositing the optional first intermediate coating 80 onto the reactor component 70, the first intermediate coating can be treated, such as by roughening using any suitable technique, and then coated with the optional second intermediate coating 90, or with the hafnium, strontium, dysprosium and/or lanthanum containing ceramic material coating 100. A roughened first intermediate coating 80 provides a particularly good bond to subsequently applied coatings. Desirably, the second intermediate coating 90 imparts a high mechanical compression strength to the first intermediate coating 80 and reduces formation of fissures in the second intermediate coating 90.

The second intermediate coating 90 is sufficiently thick to adhere to tie first intermediate coating 80 and to allow it to be processed prior to forming any additional intermediate coatings, or the outer hafnium, strontium, dysprosium and/or lanthanum containing ceramic material coating 100. The second intermediate coating 90 also can be treated, such as by roughening. The second intermediate coating 90 can have any suitable thickness that provides these desired properties, such as a thickness of at least about 0.001 inches, preferably from about 0.001 to about 0.25 inches, more preferably from about 0.001 and about 0.15 inches, and most preferably from about 0.001 inches to about 0.05 inches.

The first and second intermediate coatings can be made of any metallic, ceramic and polymer materials that are suitable for use in semiconductor plasma processing chambers. Particularly desirable metals that can be used include, but are not limited to, refractory metals, which c an withstand high processing temperatures. Preferred ceramics include, but are not limited to, $Al_2O_3$, SiC, $Si_3N_4$, BC, AlN, $TiO_2$ and mixtures thereof. Preferred polymers include, but are not limited to, fluoropolymers, such as polytetrafluoroethylene and polyimides.

The intermediate coatings can be applied by any suitable deposition technique such as plating (e.g., electroless plating or electroplating), sputtering, immersion coating, chemical vapor deposition, physical vapor deposition, electrophoretic deposition, hot isostatic pressing, cold isostatic pressing, compression molding, casting, compacting and sintering, and thermal spraying (e.g., plasma spraying).

The optional first intermediate coating 80 and second intermediate coating 90 can have the same or different compositions from each other, depending on their desired properties. Additional intermediate coatings such as a third, fourth or fifth intermediate coating of the same or different materials can also be provided between the coating and the substrate if desired.

Figure 6:
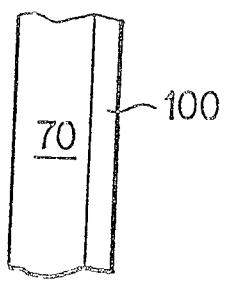
FIG. 6 shows another exemplary embodiment of a protective ceramic coating according to the invention.

FIG. 6 shows another exemplary embodiment of the hafnium, strontium, dysprosium and/or lanthanum containing ceramic material coatings according to the invention. The coating 100 can be deposited directly onto a substrate, which is an outer surface of the component 70. The coating can be have any suitable thickness that provides the desired level of wear resistance to the component. Particularly, the coating 100 can have a thickness in the range of about 0.001 inches to about 1 inch, preferably from about 0.001 inches to about 0.5 inch, and most preferably from about 0.001 inches to about 0.05 inches. The thickness of the ceramic layer can be selected to be compatible with the plasma environment to be encountered in the reactor (e.g., etching, CVD, etc.).

As discussed above, thermal spraying is a preferred method of providing components having coating surfaces according to the invention. However, other coating methods can also be used including, for example, other deposition techniques, such as sputtering, immersion coating, chemical vapor deposition and physical vapor deposition; hot isostatic pressing; cold isostatic pressing; compression molding; casting; and compaction and sintering techniques.

As mentioned above, components of semiconductor processing apparatus can also be manufactured as monolithic bodies from hafnium, strontium, dysprosium and/or lanthanum containing ceramic material. These monolithic bodies can be separate bodies or coverings for other components. For example, the hafnium, strontium, dysprosium and/or lanthanum containing ceramic materials according to the invention can be formed into coverings, such as liners, constructed to cover exposed surfaces of reactor components. These coverings can be attached to surfaces in reactor chambers by any suitable fastening technique, including, for example, adhesive bonding or by mechanical fasteners. When fasteners are used, the fasteners themselves, if exposed to the plasma, should preferably also be made from an erosion resistant material to enhance their service life. Additionally, the hafnium, strontium, dysprosium and/or lanthanum containing ceramic material coverings may be constructed to interlock with the underlying reactor component. Monolithic coverings can be provided over any suitable substrate, such as, for example, over walls and other surfaces.

An exemplary method of manufacturing monolithic bodies from hafnium, strontium, dysprosium and/or lanthanum containing ceramic materials may include preparing a slurry containing, for example, hafnium oxide, strontium oxide, dysprosium oxide and/or lanthanum oxide; forming a green compact in a desired shape and size from the slurry; and sintering the compact to form a sintered body. The green compact can be formed in the shape of any desired plasma reactor component. Details of ceramic processing techniques are given in *Introduction to Ceramics, 2$^{nd}$ Edition*, by W. D. Kingery, H. K. Bowen, and D. R. Uhlmann (J. Wiley & Sons, 1976). This description is incorporated herein by reference in its entirety.

Figure 7:
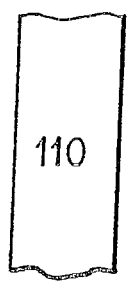
FIG. 7 shows an exemplary embodiment of a monolithic component according to the invention.

The monolithic components are preferably plasma-exposed components of plasma reactors. Suitable components can include, for example, chamber walls, substrate supports, gas distribution systems including showerheads, baffles, rings, nozzles, fasteners, heating elements, plasma screens, liners, transport module components, such as robotic arms, fasteners, inner and outer chamber walls, etc., and the like. A specific example of such a component is the reactor component 110 shown in FIG. 7. The reactor component 110 is a monolithic body manufactured from a hafnium oxide, strontium oxide, dysprosium oxide and/or lanthanum oxide containing ceramic material.

The hafnium oxide, strontium oxide, dysprosium oxide and/or lanthanum containing ceramic material can be provided on all or part of the reactor chamber and components. In a preferred embodiment, the coating or monolithic body is provided on the regions of the reactor chamber that are exposed to the plasma environment, such as those parts in direct contact with the plasma, or parts located behind chamber components (e.g., liners). Additionally, it is preferred that the hafnium oxide, strontium oxide, dysprosium oxide and/or lanthanum containing coating or monolithic body be provided at regions of the reactor chamber that are subjected to relatively high bias voltages (i.e. relatively high sputter ion energies).

By either applying a hafnium, strontium, dysprosium and/or lanthanum containing ceramic coating or covering, or by constructing a monolithic hafnium, strontium, dysprosium and/or lanthanum containing ceramic component, in accordance with the invention, advantages are realized. Namely, lower erosion rates are achievable in plasma reactors. As a result, the hafnium, strontium, dysprosium and/or lanthanum containing ceramic coatings, coverings and components according to the invention can decrease levels of metal and particulate contamination, lower costs by increasing the lifetime of consumables, decrease process drifts and reduce the levels of corrosion of chamber parts and substrates.

The hafnium, strontium, dysprosium and/or lanthanum containing ceramic coatings and components according to the invention can provide an extremely hard, wear resistant surface. Such coating or component is desirably free of materials that react with processing chamber gases and is chemically inert such that there is low or no particle contamination, little or no corrosion, little or no metal contamination and/or little or no volatile etch products.

While the invention has been described in detail with reference to specific embodiments thereof, it will be apparent to those skilled in the art that various changes and modifications can be made, and equivalents employed, without departing from the scope of the appended claims.

What is claimed is:

1. A component of a semiconductor processing apparatus, comprising at least a portion comprising a ceramic material, the portion comprising an outermost surface of the component, and the ceramic material comprising a material selected from the group consisting of lanthanum nitride and lanthanum carbide as a single largest constituent of the ceramic material, wherein the component comprises a substrate, a coating of the ceramic material over the substrate, and at least one intermediate layer on the substrate, wherein the coating is over the at least one intermediate layer, and wherein the substrate comprises bare aluminum without an anodized surface.

2. The component of claim 1, wherein the coating has a thickness of from about 0.001 in. to about 0.050 in.

3. The component of claim 1, wherein the coating consists essentially of the ceramic material.

4. The component of claim 1, wherein the ceramic material further comprises at least one material selected from the group consisting of oxides, nitrides, borides, fluorides and carbides of the elements of the lanthanide series of the periodic table.

5. The component of claim 1, which is selected from the group consisting of a chamber wall, a chamber liner, a gas distribution plate, a gas ring, a pedestal, an electrostatic chuck and a plasma focus ring.

6. A plasma etch reactor comprising at least one component according to claim 1.

7. A process of manufacturing a component of a semiconductor processing apparatus according to claim 1, comprising applying the ceramic material as a coating over a substrate, the coating comprising an outermost surface of the component; applying at least one intermediate layer on the substrate; and applying the coating on the at least one intermediate layer.

8. The process of claim 7, wherein the coating consists essentially of the ceramic material.

9. The process of claim 7, further comprising at least one of:
  treating the substrate before applying the at least one intermediate layer to enhance adhesion of the at least one intermediate layer on the substrate; and
  treating the at least one intermediate layer before applying the ceramic material to enhance adhesion of the ceramic material on the at least one intermediate layer.

10. The process of claim 7, wherein the ceramic material is applied on the substrate by thermal spraying.

11. The process of claim 7, wherein the ceramic material further comprises at least one material selected from the group consisting of (i) oxides, nitrides, borides, fluorides and carbides of the elements of Groups VA, VIA, VIIA, VIIIA, IB, IIB and IVB of the periodic table, and (ii) oxides, nitrides, borides, fluorides and carbides of the elements of the lanthanide series of the periodic table.

12. The component of claim 1, wherein the coating is deposited by plasma spraying.

13. The component of claim 1, wherein the substrate comprises a roughened surface.

14. The component of claim 1, wherein the at least one intermediate layer comprises a refractory metal, SiC, $Si_3N_4$, BC, AlN, $TiO_2$, a fluoropolymer or polyimide.

15. The component of claim 14, wherein the fluoropolymer comprises a polytetrafluoroethylene.

* * * * *